United States Patent
Adachi

(10) Patent No.: US 9,078,366 B2
(45) Date of Patent: Jul. 7, 2015

(54) PRINTED WIRING BOARD AND METHOD FOR MANUFACTURING THE SAME

(71) Applicant: IBIDEN CO., LTD., Ogaki-shi (JP)

(72) Inventor: Takema Adachi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/041,858

(22) Filed: Sep. 30, 2013

(65) Prior Publication Data
US 2014/0090878 A1    Apr. 3, 2014

(30) Foreign Application Priority Data

Sep. 28, 2012  (JP) .................................. 2012-216531

(51) Int. Cl.
| | |
|---|---|
| H05K 1/03 | (2006.01) |
| H05K 1/11 | (2006.01) |
| H05K 3/46 | (2006.01) |
| H05K 3/42 | (2006.01) |

(52) U.S. Cl.
CPC ................ *H05K 1/036* (2013.01); *H05K 3/465* (2013.01); *H05K 3/429* (2013.01); *Y10T 29/49165* (2015.01); *H05K 3/427* (2013.01); *H05K 3/4602* (2013.01); *H05K 3/4676* (2013.01); *H05K 2201/09854* (2013.01)

(58) Field of Classification Search
CPC ....... H05K 1/036; H05K 3/465; H05K 3/429; H05K 3/4602; H05K 3/4676; H05K 2201/09854; H05K 3/427; Y10T 29/49165
USPC .................. 174/255, 256, 258, 262, 264, 266
See application file for complete search history.

(56) References Cited

U.S. PATENT DOCUMENTS

| | | | |
|---|---|---|---|
| 2004/0151882 A1* | 8/2004 | Tani et al. ...................... | 428/209 |
| 2011/0232953 A1* | 9/2011 | Oga et al. ....................... | 174/258 |

FOREIGN PATENT DOCUMENTS

JP    2011-210795    10/2011

* cited by examiner

*Primary Examiner* — Hoa C Nguyen
(74) *Attorney, Agent, or Firm* — Oblon, McClelland, Maier & Neustadt, L.L.P.

(57) ABSTRACT

A printed circuit board has a core substrate, a first conductive pattern on first surface of the substrate, a second conductive pattern on second surface of the substrate, and a through-hole conductor formed of plated material through the substrate such that the conductor is connecting the first and second patterns. The plated material is filling a through hole in the substrate, the substrate includes an insulation layer including inorganic fiber and resin, a first resin layer on one surface of the insulation layer and having the first surface of the substrate, and a second resin layer on the opposite surface of the insulation layer and having the second surface of the substrate, the first and second resin layers do not contain inorganic fiber material, and the sum of thicknesses of the first and second resin layers is set in the range of 20% or less of thickness of the substrate.

20 Claims, 14 Drawing Sheets

| Sample | | Sample A | Sample B | Sample C |
|---|---|---|---|---|
| Insulation layer | Structure | Inorganic fiber + epoxy resin + inorganic filler | | |
| | Thickness (a) | 94 μm | 142 μm | 190 μm |
| | Inorganic filler content | 65 wt% | | |
| First resin layer | Structure | Epoxy resin | | |
| | Thickness (b1) | 3 μm | 4 μm | 5 μm |
| | Inorganic filler content | 0 wt% | | |
| Second resin layer | Structure | Epoxy resin | | |
| | Thickness (b2) | 3 μm | 4 μm | 5 μm |
| | Inorganic filler content | 0 wt% | | |
| Core substrate thickness (a+b1+b2) | | 100 μm | 150 μm | 200 μm |
| First, Second resin layer ratio 100 × (b1+b2)/(a+b1+b2) | | 6.00 % | 5.30 % | 5.00 % |
| 1st copper foil | Thickness | 3 μm | | |
| 2nd copper foil | Thickness | 3 μm | | |
| 1st conductive layer | Thickness | 15 μm | 18 μm | 20 μm |
| 2nd conductive layer | Thickness | 15 μm | 18 μm | 20 μm |
| Evaluation | Copper foil peeling | ○ | | |
| | Substrate warping | ○ | | |

FIG.12

| Sample | | Sample D | Sample E | Sample F |
|---|---|---|---|---|
| Insulation layer | Structure | Inorganic fiber + epoxy resin + inorganic filler | | |
| | Thickness (a) | 86 μm | 138 μm | 194 μm |
| | Inorganic filler content | 70 wt% | 70 wt% | 50 wt% |
| First resin layer | Structure | Epoxy resin + inorganic filler | Epoxy resin + inorganic filler | Epoxy resin |
| | Thickness (b1) | 7 μm | 6 μm | 3 μm |
| | Inorganic filler content | 5 wt% | 3 wt% | 0 wt% |
| Second resin layer | Structure | Epoxy resin + inorganic filler | Epoxy resin + inorganic filler | Epoxy resin |
| | Thickness (b2) | 7 μm | 6 μm | 3 μm |
| | Inorganic filler content | 5 wt% | 3 wt% | 0 wt% |
| Core substrate thickness (a+b1+b2) | | 100 μm | 150 μm | 200 μm |
| First, Second resin layer ratio 100 × (b1+b2)/(a+b1+b2) | | 14.00 % | 8.00 % | 3.00 % |
| 1st copper foil | Thickness | 3 μm | | |
| 2nd copper foil | Thickness | 3 μm | | |
| 1st conductive layer | Thickness | 18 μm | | |
| 2nd conductive layer | Thickness | 18 μm | | |
| Evaluation | Copper foil peeling | ○ | | |
| | Substrate warping | ○ | | |

FIG.13

| Sample | | Sample G | Sample H | Sample I |
|---|---|---|---|---|
| Insulation layer | Structure | Inorganic fiber + epoxy resin + inorganic filler | | |
| | Thickness (a) | 150 μm | 140 μm | 194 μm |
| | Inorganic filler content | 65 wt% | 65 wt% | 70 wt% |
| First resin layer | Structure | No | Epoxy resin | Epoxy resin + inorganic filler |
| | Thickness (b1) | | 30 μm | 3 μm |
| | Inorganic filler content | | 0 wt% | 70 wt% |
| Second resin layer | Structure | No | Epoxy resin | Epoxy resin + inorganic filler |
| | Thickness (b2) | | 30 μm | 3 μm |
| | Inorganic filler content | | 0 wt% | 70 wt% |
| Core substrate thickness (a+b1+b2) | | 150 μm | 200 μm | 200 μm |
| First, Second resin layer ratio 100 × (b1+b2)/(a+b1+b2) | | 0.00 % | 30.00 % | 3.00 % |
| 1st copper foil | Thickness | 3 μm | | |
| 2nd copper foil | Thickness | 3 μm | | |
| 1st conductive layer | Thickness | 18 μm | | |
| 2nd conductive layer | Thickness | 18 μm | | |
| Evaluation | Copper foil peeling | × | ○ | △ |
| | Substrate warping | ○ | × | ○ |

FIG.14

PRINTED WIRING BOARD AND METHOD FOR MANUFACTURING THE SAME

CROSS-REFERENCE TO RELATED APPLICATION

The present application is based upon and claims the benefit of priority from U.S. Application No. 2012-216531, filed Sep. 28, 2012, the entire contents of which are incorporated herein by reference.

BACKGROUND OF THE INVENTION

1. Field of the Invention

The present invention relates to a printed circuit board and a method of manufacturing the same.

2. Description of Background Art

JP 2011-210795 A describes a printed circuit board in which a through hole is formed in a laminated sheet formed of three insulation layers (first, second, and third insulation layers), and is filled with conductors. The entire contents of JP 2011-210795 A are incorporated herein by reference.

SUMMARY OF THE INVENTION

According to one aspect of the present invention, a printed circuit board has a core substrate, a first conductive pattern formed on a first surface of the core substrate, a second conductive pattern formed on a second surface of the core substrate on the opposite side of the core substrate with respect to the first surface, and a through hole conductor formed through the core substrate and formed of a plated material such that the through hole conductor is connecting the first conductive pattern and the second conductive pattern. The plated material of the through hole conductor is formed in a through hole formed in the core substrate such that the plated material is filling the through hole of the core substrate, the core substrate includes an insulation layer including an inorganic fiber material and a resin material, a first resin layer formed on one surface of the insulation layer and having the first surface of the core substrate, and a second resin layer formed on an opposite surface of the insulation layer and having the second surface of the core substrate, and the first and second resin layers are formed such that the first and second resin layers do not contain an inorganic fiber material and the sum of thicknesses of the first and second resin layers is set in the range of 20% or less of a thickness of the core substrate.

According to another aspect of the present invention, a method for manufacturing a printed circuit board includes forming a core substrate having a through hole penetrating through the core substrate, forming a first conductive pattern on a first surface of the core substrate, forming a second conductive pattern on a second surface of the core substrate on the opposite side of the core substrate with respect to the first surface, forming a through hole conductor formed of a plated material in the through hole in the core substrate such that the through hole is filled by the plated material and the through hole conductor connects the first conductive pattern and the second conductive pattern. The forming of the core substrate includes forming an insulation layer including an inorganic fiber material and a resin material, forming a first resin layer on one surface of the insulation layer such that the first resin layer forms the first surface of the core substrate, and forming a second resin layer on the opposite surface of the insulation layer such that the second resin layer forms the second surface of the core substrate, and the first and second resin layers are formed such that the first and second resin layers do not contain an inorganic fiber material and the sum of thicknesses of the first and second resin layers is set in the range of 20% or less of a thickness of the core substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 12 is a table describing first test results to illustrate characteristics of the printed circuit board according to the embodiment of the invention;

FIG. 13 is a table describing second test results to illustrate characteristics of the printed circuit board according to the embodiment of the invention;

FIG. 14 is a table describing third test results to illustrate characteristics of the printed circuit board according to the embodiment of the invention;

DETAILED DESCRIPTION OF THE EMBODIMENTS

Figure 1:
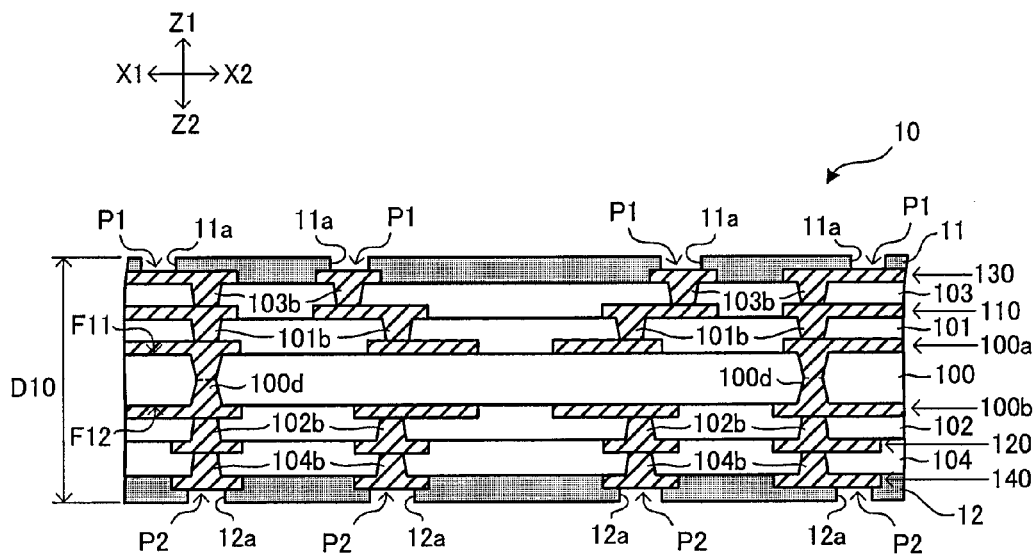
FIG. 1 is a cross-sectional view of a printed circuit board according to an embodiment of the invention.

The embodiments will now be described with reference to the accompanying drawings, wherein like reference numerals designate corresponding or identical elements throughout the various drawings.

In the drawings, arrows (Z1 and Z2) each indicate a lamination direction of a circuit board (or a thickness direction of the circuit board) corresponding to a direction to a normal line to main surfaces (upper and lower surfaces) of the circuit board. Arrows (X1, X2, Y1, and Y2) each indicate a direction (or a side of each layer) perpendicular to a lamination direction. A main surface of the circuit board is on the X-Y plane. A side surface of the circuit board is on the X-Z plane or Y-Z plane. In a lamination direction, a layer closer to the core is referred to as a lower layer, and a layer farther from the core is referred to as an upper layer.

A conductive layer is formed of one or multiple conductive pattern(s). The conductive layer may contain a conductive pattern forming an electric circuit such as wiring (including ground), a pad, or a land, and alternatively may contain a planar conductive pattern not forming an electric circuit.

An opening may be an aperture or a groove, as well as a recess, a notch, or the like.

A circuit board 10 according to the embodiment is, for example, a multilayer printed circuit board (double-sided rigid circuit board) illustrated in FIG. 1. The circuit board 10 has a substrate 100, insulation layers 101, 102, 103, and 104, conductive layers (100a, 100b, 110, 120, 130, and 140), a through hole conductor (100d), via conductors (101b, 102b, 103b, and 104b), and solder resist layers 11 and 12. The circuit board 10 of the embodiment is, for example, a rigid circuit board in a rectangular plate shape. However, that is not the only option. The circuit board 10 may be formed to be other than a rectangular plate shape, and may be a flexible circuit board. The circuit board 10 may include, for example, a circuit of an electronic device. An electronic device may be mounted on or in the circuit board 10. One (on a Z1 side) of the upper and lower surfaces (two main surfaces) of the substrate 100 is referred to as a surface (F11), and the other (on a Z2 side) is referred to as a surface (F12).

The substrate 100 corresponds to a core substrate of the circuit board 10. The conductive layer (100a) is formed on the surface (F11) of the substrate 100, and the conductive layer (100b) is formed on the surface (F12) of the substrate 100. The conductor (through hole conductor 100d) in the aperture formed in the substrate 100 electrically connects the conductive layers (100a and 100b). In the circuit board 10 of the embodiment, the substrate 100, the through hole conductor (100d), and the conductive layers (100a and 100b) correspond to the core.

In the circuit board 10 according to the embodiment, the insulation layers 101 and 103 (i.e., interlayer insulation layers) and the conductive layers 110 and 130 are formed alternately on the surface (F11) of the substrate 100 and the conductive layer (100a), respectively. The insulation layers 102 and 104 (interlayer insulation layers) and the conductive layers 120 and 140 are formed alternately on the surface (F12) of the substrate 100 and the conductive layer (100b), respectively. These conductive layers are electrically and mutually connected through conductors (for example, the via conductors 101b, 102b, 103b, and 104b) formed in the interlayer insulation layers.

The conductive layers, the interlayer insulation layers, and the via conductors laminated on the core correspond to buildup sections. In the following, the lowermost buildup section is referred to as a lower buildup section, and a buildup section in the upper layer with respect to the lower buildup section is referred to as an upper buildup section. In this embodiment, lower buildup sections are formed respectively with the insulation layers 101 and 102, the conductive layers 110 and 120, and the via conductors (101b and 102b). The upper buildup sections are formed respectively with the insulation layers 103 and 104, the conductive layers 130 and 140, and the via conductors (103b and 104b).

A solder resist layer 11 is arranged on the outermost insulation layer 103 and the conductive layer 130, and a solder resist layer 12 is arranged on the outermost insulation layer 104 and the conductive layer 140. The solder resist layers 11 and 12 are provided with openings (11a and 12a), respectively, and the conductive layers 130 and 140 exposed through the openings (11a and 12a) form pads (P1 and P2) (external connection terminals), respectively. Other circuit boards, electronic parts or the like are mounted on one or both of the surfaces of the circuit board 10 so that the circuit board 10 can be used as a circuit substrate of, for example, a portable device (a cellular phone or the like). The circuit board 10 of the embodiment is a package board (PKG board) that has electronic components (IC chips and the like) mounted on one surface, and has a bump on the other surface for being mounted on a motherboard. A PoP (Package on Package) technique may be applied to the circuit board 10.

Each conductor (conductive layer, via conductor or the like) of the circuit board 10 is made of, for example, copper. Each via conductor is formed of, for example, a filled conductor. However, that is not the only option, and each via conductor may be formed of a conformal conductor. Each insulation layer (except for the substrate 100) of the circuit board 10 is made of a base such as glass fabric, nonwoven fabric of aramid fiber, or paper impregnated with epoxy resin, polyimide resin, phenolic resin, or the like. Each insulation layer (except for the substrate 100) of the circuit board 10 contains, for example, inorganic filler. However, materials of the conductors and the insulation layers of the circuit board 10 are not limited specifically. For example, each insulation layer (except for the substrate 100) may be made of only resin without using the base (glass fabric or the like), and may not contain inorganic filler.

The solder resist layers 11 and 12 are each made of photosensitive resin using acrylic-epoxy resin, thermosetting resin primarily made of epoxy resin, ultraviolet curing resin, or the like.

In FIG. 1, thickness (D10) of the circuit board 10 is approximately 400 μm, for example. The thickness of each conductive layer except for the conductive layers (100a and 100b) is 15 μm, for example. The thickness of each insulation layer except for the substrate 100 is 40 μm, for example. The thicknesses of the solder resist layers 11 and 12 are each set in a range of, for example, 13 to 25 μm.

Figure 2:
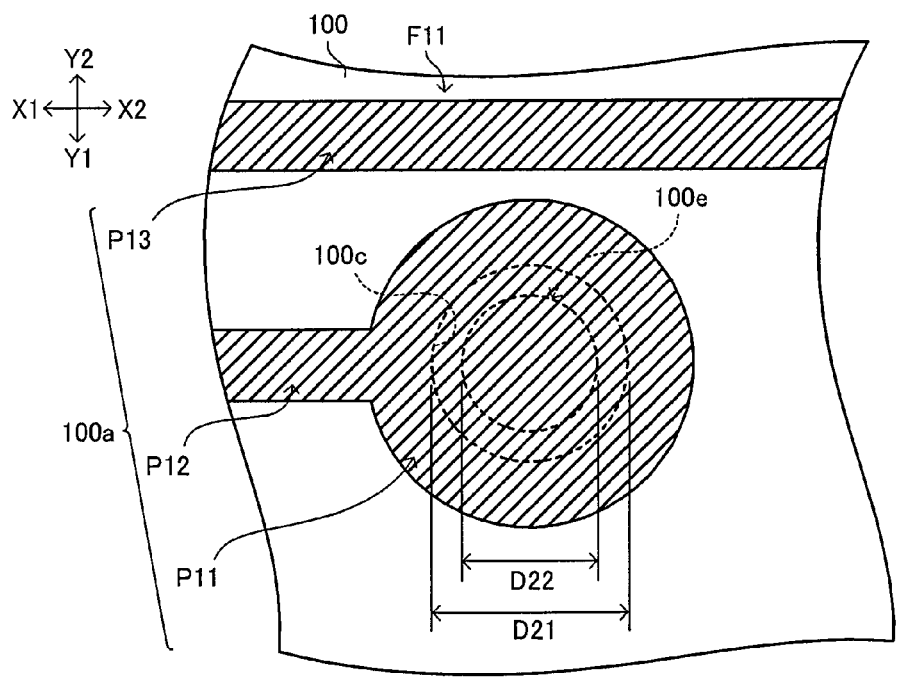
FIG. 2 is an enlarged plan view illustrating a through hole conductor of the printed circuit board shown in FIG. 1 and its periphery.
Figure 3:
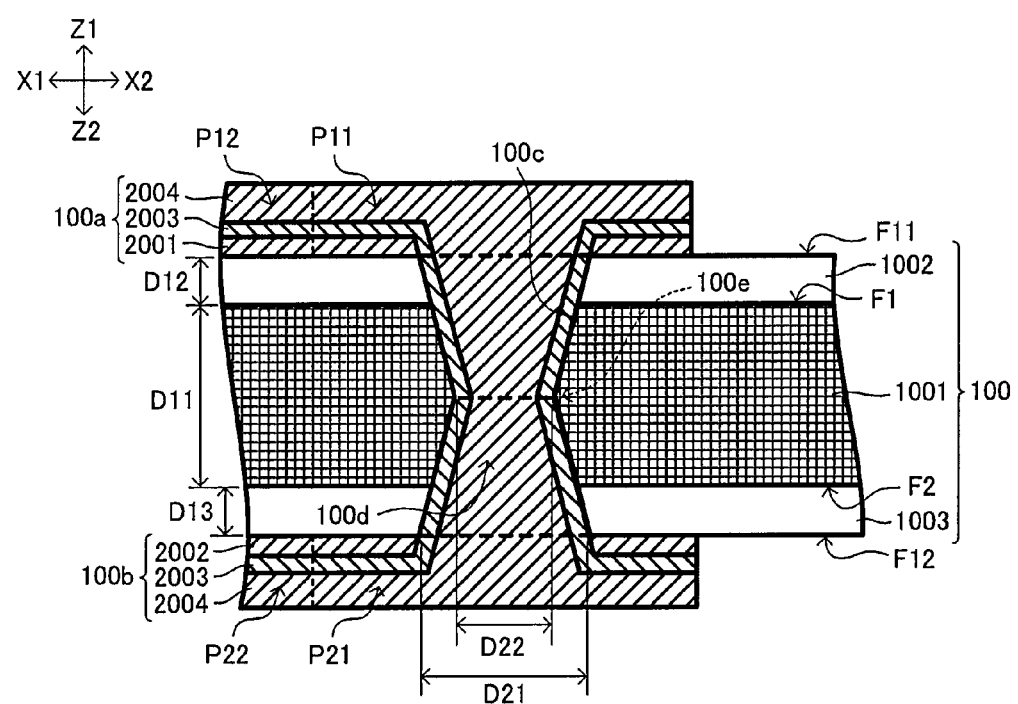
FIG. 3 is an enlarged cross-sectional view illustrating the through hole conductor of the printed circuit board shown in FIG. 1 and its periphery.

Referring to FIGS. 2 to 4, the core of the circuit board 10 according to the embodiment will be described below in detail.

FIG. 2 is an enlarged plan view illustrating the through hole conductor 100d on the X1 side of the circuit board 10 illustrated in FIG. 1 as well as its periphery. FIG. 2 illustrates the conductive layer (100a) on the surface (F11) of the substrate 100.

In this embodiment, as illustrated in FIG. 2, the conductive layer (100a) includes a land (P11) in a disc shape, wiring (P12) in a linear shape connected to the land (P11), and wiring (P13) located near the land (P11). The wiring (P13) is electrically insulated from the land (P11).

FIG. 3 is an enlarged cross-sectional view illustrating the through hole conductor (100d) on the (X1) side of the circuit board 10 illustrated in FIG. 1 and its periphery. As illustrated in FIG. 3, the core of the circuit board 10 according to the embodiment is formed of the substrate 100, the through hole conductor (100d), and the conductive layers (100a and 100b). The conductive layer 100b has a land (P21) of the through hole conductor (100d), and wiring (P22) in a linear shape connected to the land (P21). The land (P21) and the wiring (P22) have forms similar to those, for example, of the land (P11) and wiring (P12) included in the conductive layer (100b) (see FIG. 2), respectively. For example, the land (P21) and the wiring (P22) are respectively arranged symmetrically to the land (P11) and the wiring (P12) with respect to the X-Y plane.

As illustrated in FIG. 3, the substrate 100 is formed of an insulation layer 1001, and resin layers 1002 and 103. In the following, one (on the Z1 side) of the upper and lower surfaces (the two main surfaces) of the insulation layer 1001 is referred to as a surface (F1), and the other (on the Z2 side) is referred to as a surface (F2). The resin layer 1002 is formed on the surface (F1) of the insulation layer 1001, and the resin layer 1003 is formed on the surface (F2) of the insulation layer 1001. In this embodiment, the upper surface of the resin layer 1002 corresponds to the surface (F11) of the substrate 100, and the upper surface of the resin layer 1003 corresponds to the surface (F12) of the substrate 100.

The substrate 100 has a through hole (100c). A conductor (for example, copper plating) fills the through hole (100c) to form the through hole conductor (100d) (for example, a filled conductor). The through hole conductor (100d) has, for example, an hourglass-like shape. Thus, the through hole conductor (100d) has a narrowed portion (100e). The width of the through hole conductor (100d) gradually decreases from the surface (F11) toward the narrowed portion (100e), while also gradually decreasing from the surface (F12) toward the narrowed portion (100e). However, that is not the only option, and the through hole conductor (100d) may have any shape, for example, a substantially cylindrical shape.

The conductive layer (100a) is formed of metal foil 2001 (for example, copper foil), an electroless plating film 2003 made of copper, for example, and an electrolytic plating 2004 made of copper, for example, laminated in that order on the surface (F11) of the substrate 100. The conductive layer (100b) is formed of, by laminating on the surface (F12) of the substrate 100 in the following order, metal foil 2002 (for example, copper foil), the electroless plating film 2003 made of copper, for example, and the electrolytic plating 2004 made of copper, for example. In this embodiment, the metal foil 2001 is located as the lowermost layer of the conductive layer (100a), and the metal foil 2002 is located as the lowermost layer of the conductive layer (100b). The metal foil 2001 is in contact with the resin layer 1002, and the metal foil 2002 is in contact with the resin layer 1003.

The through hole conductor (100d) is formed of the electroless plating film 2003 made of copper, for example, and the electrolytic plating 2004 made of copper, for example, laminated in that order on a wall surface of the through hole (100c). The through hole conductor (100d) is formed by plating at the same time that the conductive layers (100a and 100b) are formed on both surfaces of the substrate 100 (insulation layer). Therefore, the through hole conductor (100d) is connected to at least part of the conductive layers (100a and 100b) formed on both surfaces of the substrate 100. Specifically, as illustrated in FIG. 3, the electroless plating film 2003 and the electrolytic plating 2004 are formed over the through hole conductor (100d) and both of its ends and over the conductive layers (100a and 100b), and the electroless plating film 2003 and the electrolytic plating 2004 are each formed continuously without an interface (i.e., integrally).

Referring to FIG. 3, thickness (D11) of the insulation layer 1001 is set at 140 μm, for example, thickness (D12) of the resin layer 1002 at 5 μm, for example, and thickness (D13) of the resin layer 1003 at 5 μm, for example. Thus, the sum of the thicknesses (D12 and D13) is 10 μm, which is about 6.67% of the thickness (=150 μm) of the substrate 100.

In this embodiment, as described above, the sum of the thicknesses (D12 and D13) of the resin layers 1002 and 1003 is smaller than 20% of the thickness of the substrate 100.

In this embodiment, the thickness of the insulation layer 1001 occupies about 93% of the thickness of the substrate 100 (that is, the sum of the thicknesses of the resin layer 1002, the insulation layer 1001 and the resin layer 1003). When the rate of the insulation layer 1001 containing the inorganic fiber and inorganic filler increases, a coefficient of thermal expansion of the substrate 100 decreases, and warping of the circuit board 10 is thought to be suppressed.

The thickness of each conductive layer (100a) or (100b) is, for example, 16 rim. The thickness of each metal foil 2001 or 2002 is, for example, 2 to 3 μm. The thicknesses of the electroless plating film 2003 forming the conductive layer (100a) and the electroless plating film 2003 forming the conductive layer (100b) are each, for example, 1 μm. The thicknesses of the electrolytic plating 2004 forming the conductive layer (100a) and the electrolytic plating 2004 forming the conductive layer (100b) are each, for example, 12 μm. In this embodiment, the conductive layer (100a) (metal foil 2001, electroless plating film 2003, and electrolytic plating 2004) has the same thickness as the conductive layer (100b) (metal foil 2002, electroless plating film 2003, and electrolytic plating 2004). This is not restrictive, and the conductive layers (100a and 100b) may have different thicknesses, respectively.

In FIGS. 2 and 3, the opening at each end of the through hole (100c) has a width (D21) (diameter) of, for example, 80 μm. The narrowed portion (100e) of the through hole (100c) has a width (D22) (diameter) of, for example, 50 μm.

The insulation layer 1001 is formed of inorganic fiber impregnated with resin. In this embodiment, the insulation layer 1001 is formed of glass cloth impregnated with epoxy resin. The epoxy resin has a thermosetting property. This is not restrictive, and the insulation layer 1001 may be formed of, for example, inorganic fiber such as nonwoven fabric of aramid fiber impregnated with polyimide resin or phenolic resin.

Neither the resin layer 1002 nor 1003 contains inorganic fiber. In this embodiment, the resin layers 1002 and 1003 are each formed of thermosetting epoxy resin. However, that is not the only option. The resin layers 1002 and 1003 may each be made of, for example, polyimide resin, BT resin, allyl polyphenylene ether resin (A-PPE resin), aramid resin, liquid crystal polymer (LCP), PEEK resin, or PTFE resin (fluororesin).

Figure 4A:
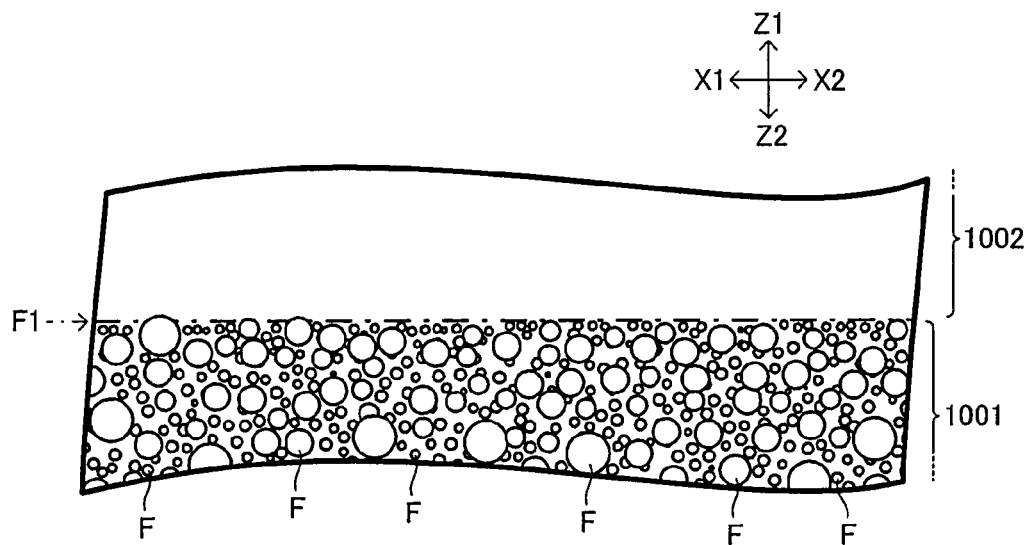
FIG. 4A is a cross-sectional view illustrating an inorganic filler contained in an insulation layer forming a core of the printed circuit board shown in FIG. 1.

In this embodiment, the insulation layer 1001 is formed of inorganic fiber (for example, glass cloth) impregnated with resin (for example, epoxy resin) containing inorganic filler at a rate of 40 to 70 wt % (ratio by weight). Thus, the insulation layer 1001 is formed of inorganic fiber, resin, and inorganic filler. When the resin and the inorganic filler have weights of (W1) and (W2), respectively, (100×W2/(W1+W2)) falls within a range of 40 to 70. Also, as illustrated in FIG. 4A, the insulation layer 1001 in this embodiment contains both small-particle inorganic filler (F) and large-particle inorganic filler (F). Specifically, the smallest diameter of the inorganic filler (F) is 1 μm, and the largest diameter of the inorganic filler (F) is 5 μm. The content of the inorganic filler (F) is substantially uniform throughout, for example, the insulation layer 1001.

For example, the inorganic filler (F) is preferably silica-based filler (fused quartz, isotropic silica, silica, talc, mica, kaolin, calcium silicate, or the like). However, the inorganic filler F is not restricted to the silica-based filler and is arbitrarily selected.

Figure 4B:
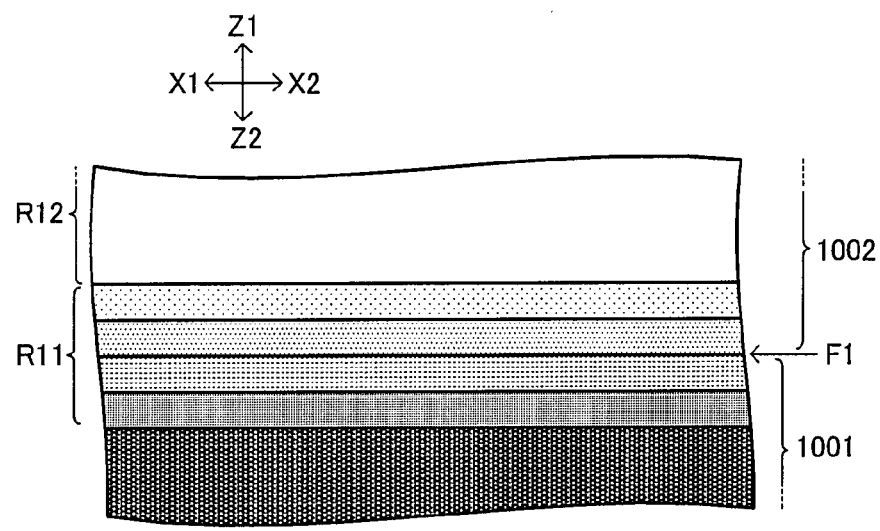
FIG. 4B illustrates a distribution of the inorganic filler in a boundary between the insulation layer and a resin layer forming the core of the printed circuit board shown in FIG. 1.

In this embodiment, as illustrated in FIG. 4A, the resin layer 1002 does not contain inorganic filler in its surface layer. As illustrated in FIG. 4B, however, the resin layer 1002 contains inorganic filler in a boundary R11 (near the surface F1) between the insulation layer 1001 and the resin layer 1002, as will be described later in detail. In the resin layer 1002, a portion (R12) (containing the surface layer) outside (on the surface (F11) side) of the boundary (R11) does not contain inorganic filler. In this embodiment, the thickness of the portion (R12) of the resin layer 1002 not containing inorganic filler is, for example, 3 μm or greater.

In FIG. 4B, dotted-line hatching represents the amount of inorganic filler; the denser the hatching, the greater is the amount of inorganic filler that is contained. In the boundary (R11) (near the surface F1) between the insulation layer 1001 and the resin layer 1002, the content of inorganic filler gradually changes such that the content of inorganic filler decreases toward the surface (F11). More specifically, in the surface layer (near the surface F1) of the insulation layer 1001, the content of inorganic filler decreases toward the resin layer 1002 (or the surface F1). The boundary (R11) has a thickness, for example, of 5 μm, in which the thickness of the portion forming the resin layer 1002 is, for example, 2 μm or less, and the thickness of the portion forming the insulation layer 1001 is, for example, 3 μm or greater.

In this embodiment, the resin layer contains inorganic filler in the form illustrated in FIGS. 4A and 4B, the same as in the resin layer 1002. More specifically, the resin layer 1003 in this embodiment does not contain inorganic filler substantially in any area except for the boundary (near the surface F2) between the insulation layer 1001 and the resin layer 1003. In the boundary (near the surface F2) between the insulation layer 1001 and the resin layer 1003, the content of the inorganic filler gradually changes so that the content decreases toward the surface (F12). However, that is not the only option, and the resin layers 1002 and 1003 may contain inorganic fillers in fashions different from each other.

In this embodiment, the content of inorganic filler in the resin layer 1002 decreases from the insulation layer 1001 toward the surface (F11), and the content of inorganic filler in the resin layer 1003 decreases from the insulation layer 1001 toward the surface (F12). Thus, in each of the boundaries between the insulation layer 1001 and the resin layer 1002, and between the insulation layer 1001 and the resin layer 1003, the content of inorganic filler decreases as the distance from the insulation layer 1001 increases. Accordingly, since the amount of inorganic filler gently changes from the portion (insulation layer 1001) containing the inorganic filler toward the portion (resin layer 1002 or 1003) not containing inorganic filler, it is thought that the adhesiveness of the insulation layer 1001 to the resin layers 1002 and 1003 is improved.

Figure 5:
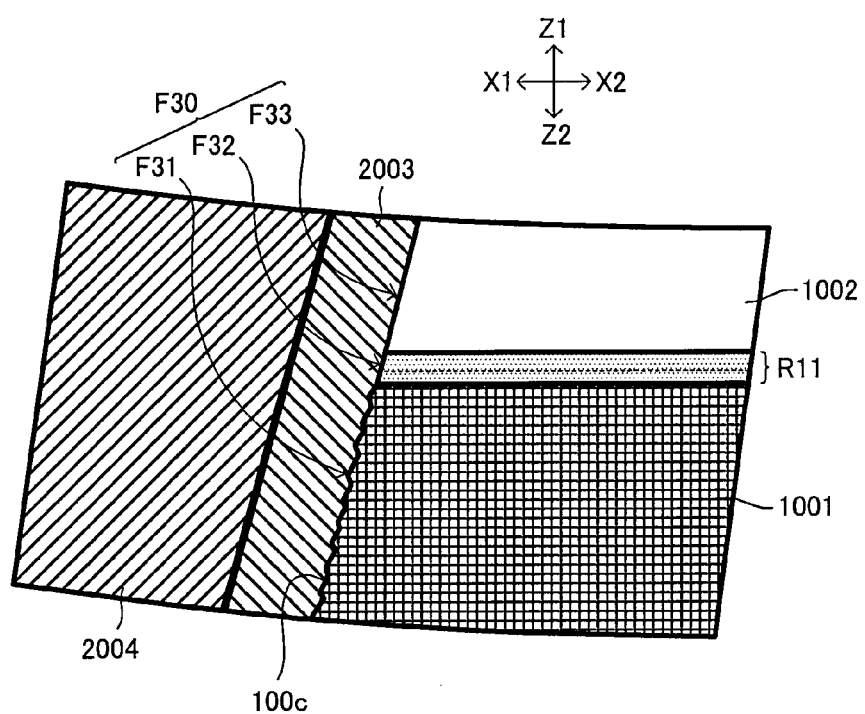
FIG. 5 is an enlarged view illustrating a through hole wall surface of the printed circuit board according to the embodiment of the invention.

As illustrated in FIG. 5, when a wall surface (F30) of the through hole (100c) in the circuit board 10 of the embodiment is observed by dividing it into side walls (F31, F32, and F33) of the insulation layer 1001, the boundary (R11), and the resin layer 1002, the roughness on the side surface (F31) tends to be greater than that on each of the side surfaces (F32) and (F33). Such greater roughness is thought to occur, since particle loss of inorganic filler is more likely to occur on the side surface (F31). On the side surface (F31), therefore, the amount of exposed inorganic fiber (the exposed surface area, the projected amount, and the like) tends to be greater than on the side surface (F32). The same applies to the side surface of the periphery of the boundary between the insulation layer 1001 and the resin layer 1003.

In this embodiment, neither the surface layer of the resin layer 1002 nor that of 1003 contains inorganic filler except for the boundary with respect to the insulation layer 1001. It is thought that this improves the electrical reliability of the circuit board 10, as will be further described with reference to FIGS. 6 to 11.

Figure 6:
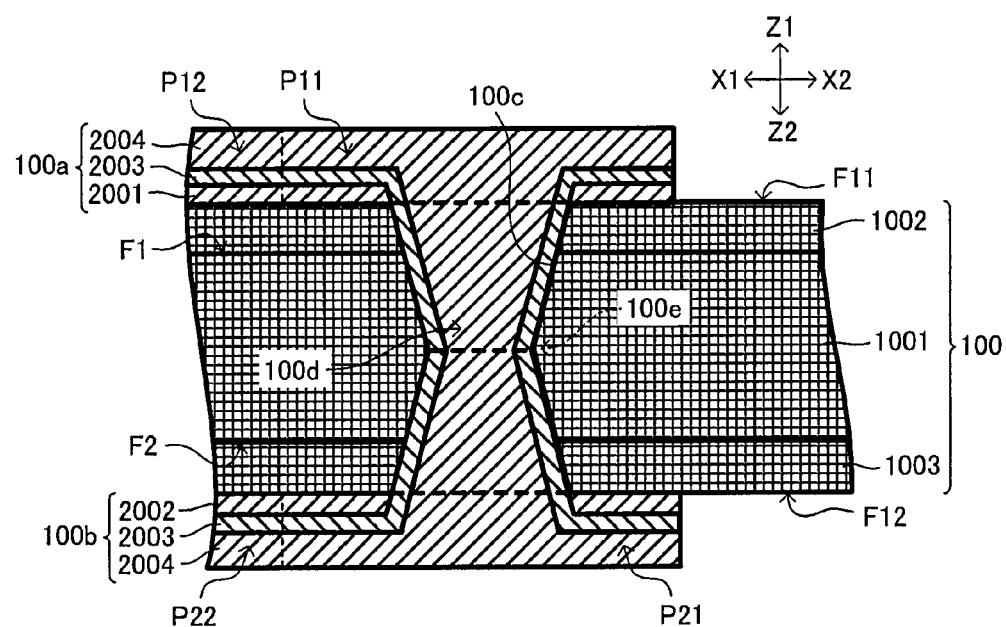
FIG. 6 is a cross-sectional view illustrating a circuit board containing the filler.

For example, a circuit board different from the circuit board 10 of the present embodiment is described as follows (hereinafter referred to as a "circuit board containing filler"). Namely, in the circuit board containing filler, as illustrated in FIG. 6, insulation layer 1001 and resin layers 1002 and 1003 each contain 40 to 60 parts by weight of inorganic filler throughout the layers. Among members of the circuit board containing filler, the same reference numerals as those forming the circuit board 10 apply to the members arranged in substantially the same manner as those of the circuit board 10.

Figure 7:
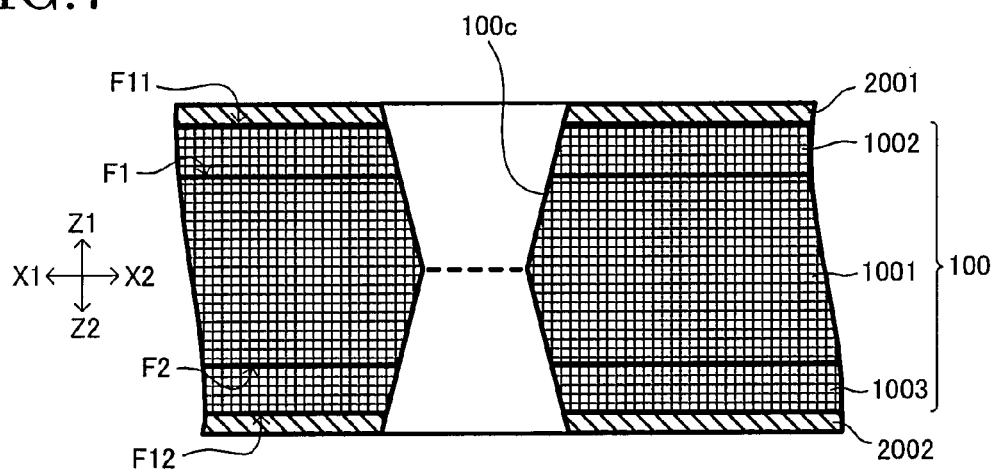
FIG. 7 is a view illustrating a step for forming a through hole in an example of a manufacturing method of the circuit board containing the filler.
Figure 8A:
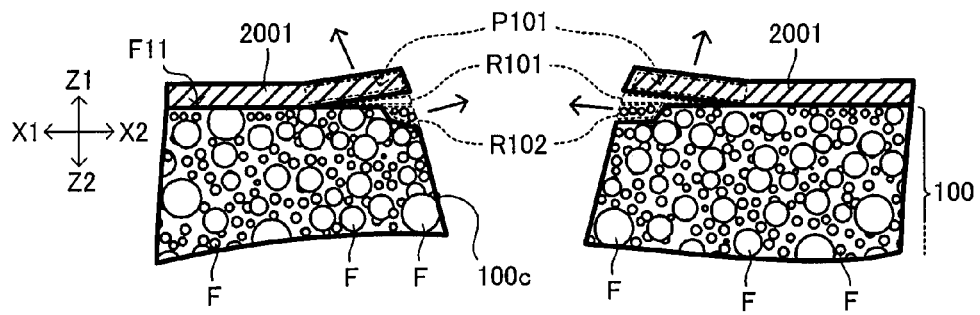
FIG. 8A is a view illustrating particle loss that may occur in the circuit board containing the filler.
Figure 8B:
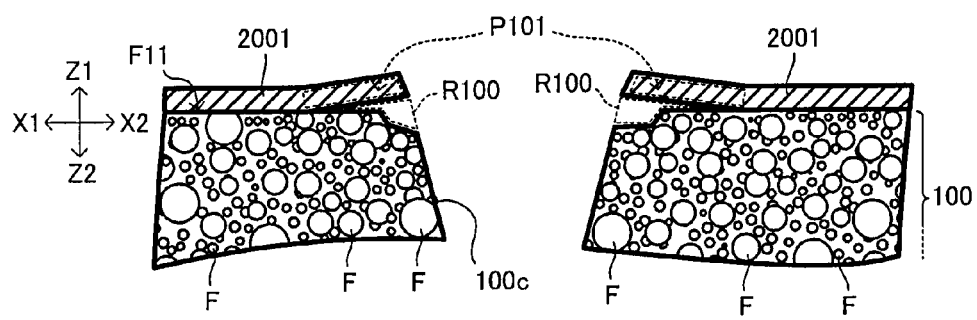
FIG. 8B is a view illustrating a state after particle loss occurred in the circuit board containing the filler.

A through hole (100c) in the circuit board (FIG. 6) containing filler is formed, for example, by preparing a substrate 100 provided with metal foil 2001 and 2002 on its opposite surfaces, for example, as shown in FIG. 7, and by performing laser irradiation penetrating through the substrate 100 and the metal foil 2001 and 2002. This substrate 100 contains inorganic filler of 40 to 60 parts by weight. The substrate 100 contains large inorganic filler as well as small inorganic filler. Therefore, when desmearing is performed on the through hole (100c), for example, after laser irradiation, the small inorganic filler is brought together with resin to form lumps (R102), and tends to peel off as illustrated in the FIG. 8A. When this peeling of the lumps (R102) occurs (particle loss), a tip end portion (P101) of the metal foil 2001 tends to peel off from the substrate 100, as illustrated in FIG. 8A. A space (R101) caused by the peeling of the metal foil 2001 (warping of the metal foil 2001) and a cavity formed when the lumps (R102) are peeled off (particle loss) cause a large space (R100) between the substrate 100 and the metal foil 2001, as illustrated in FIG. 8B.

Figure 9:
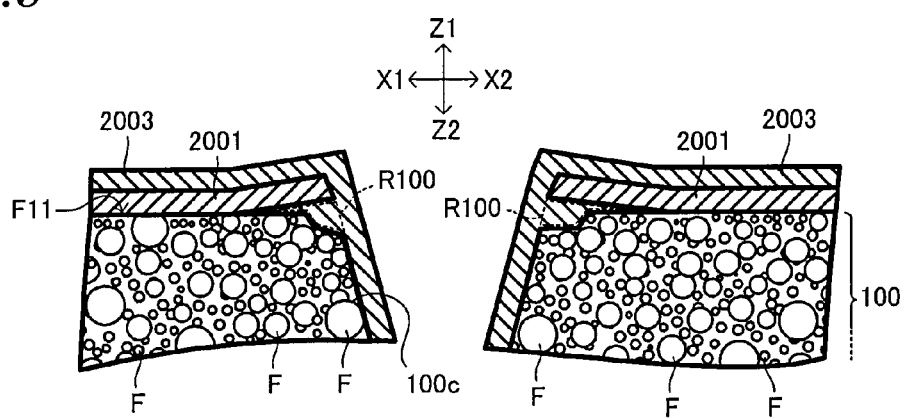
FIG. 9 is a cross-sectional view illustrating the through hole and its periphery in the circuit board containing the filler after electroless plating was performed in the state where the particle loss occurred.
Figure 10:
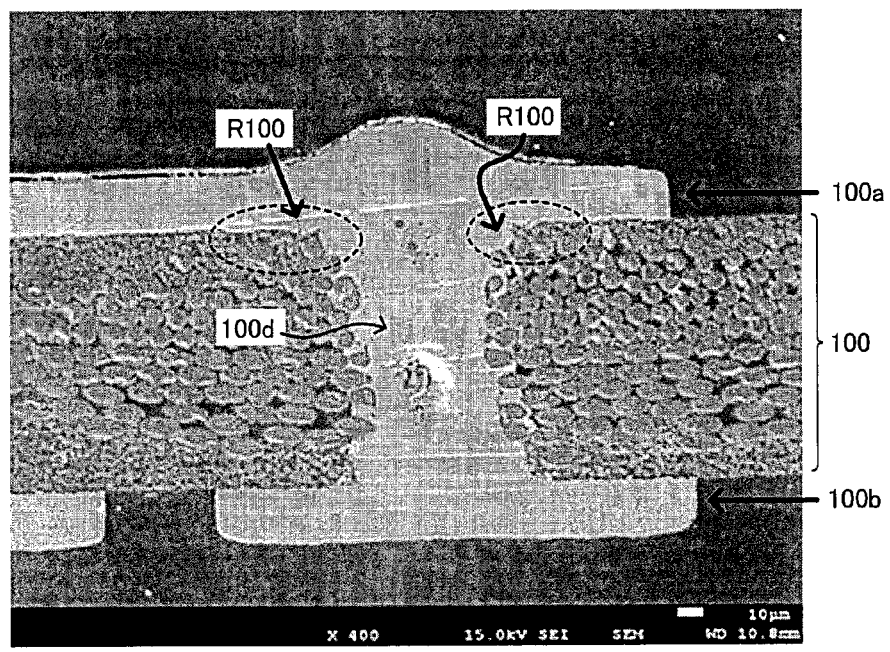
FIG. 10 is an SEM photograph illustrating the through hole conductor, which was formed by plating performed in the state where the particle loss occurred, and its periphery in the circuit board containing the filler.

It is thought that, when plating (electroless plating, for example) is performed for forming a through hole conductor (100d) in the state where the space (R100) is formed, a plating solution enters the space (R100), and a conductive layer at an edge of the through hole (100c) (that is, periphery of the through hole 100c) is liable to become partially thick as illustrated in FIG. 9. FIG. 10 is an SEM photograph illustrating the through hole conductor (100d) and its periphery after the plating was performed in the state where the particle loss had occurred.

Figure 11:
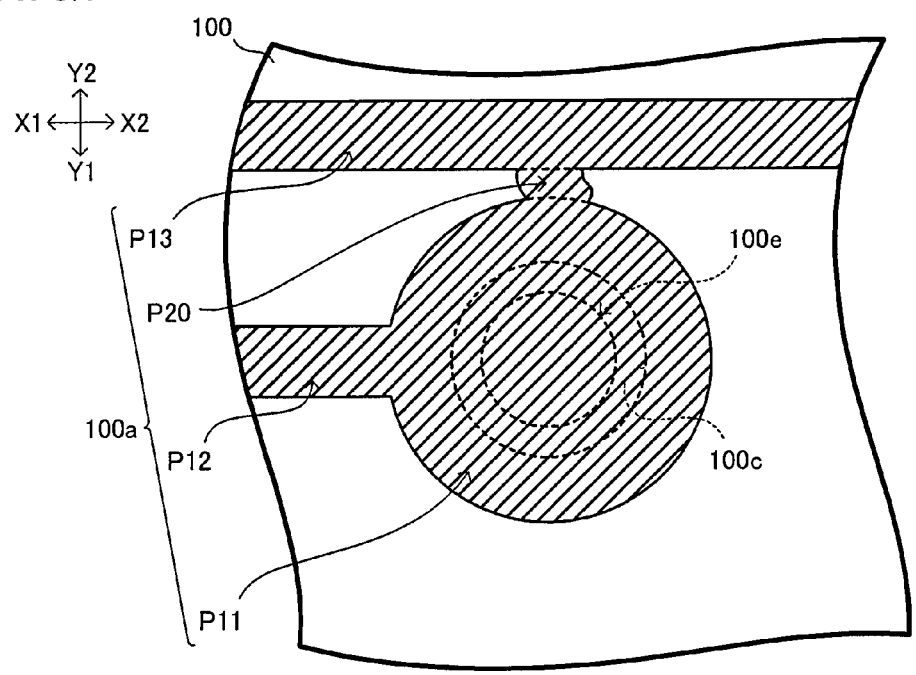
FIG. 11 illustrates a state where the particle loss caused an unwanted short circuit in the circuit board containing the filler.

When etching is performed for patterning a conductive layer (100a) (FIG. 6) in the state where the conductive layer has a partially thick portion as described above, a conductor to be removed is not removed completely by the etching from the thick portion of the conductive layer, and may partially remain. Consequently, as illustrated in FIG. 11 (corresponding to FIG. 2), a conductor (P20) that causes short-circuiting, for example, between a land (P11) and wiring (P13) near it may remain and abnormalities are likely to occur in electrical characteristics. Further, the disintegrated lumps (R102) may float in a plating solution and may adhere to a substrate surface. This may cause abnormal depositions to cause abnormalities in electrical properties.

Further, when the surface layer of the substrate 100 contains inorganic filler, the inorganic filler is exposed on the surface of the substrate 100, which may lower the adhesiveness between the substrate 100 and the metal foil 2001.

So far, the surface (F11) side (metal foil 2001 and others) of the substrate 100 has been described. However, the same applies to the surface (F12) side (metal foil 2002 and others) of the substrate 100.

Thus, neither resin layer 1002 nor resin layer 1003 in the present embodiment contains inorganic filler at the surface layer (near the surface (F11) or (F12)). Therefore, the inorganic filler is not exposed at the surface (the surface (F11) or (F12) and the wall surface of the through hole 100c) of resin layer 1002 or 1003, and hardly any particle loss as described above occurs. It is thought that this improves the adhesiveness (or connection reliability) between the resin layer 1002 and the conductive layer (100a) (particularly, metal foil 2001) thereon as well as the adhesiveness (or connection reliability) between the resin layer 1003 and the conductive layer (100b) (particularly, metal foil 2002) thereon).

Since the abnormality in electrical property due to particle loss is suppressed as described above, the electrical reliability of the circuit board 10 is thought to be improved. Consequently, the yield of the circuit boards 10 is thought to be improved.

In this embodiment, the sum of the thicknesses (D12 and D13) of the resin layers 1002 and 1003 is 20% or less of the thickness of the substrate 100. Accordingly, warping of the printed circuit board is suppressed, while adhesiveness of the metal foil is improved. This will be described below with reference to FIGS. 12 to 14.

FIGS. 12 to 14 are tables representing results of experiments performed on samples (A to I), and particularly representing results of tests about peeling of copper foil and warping of substrates performed on circuit boards (samples (A to I)) having cores illustrated in various drawings. In the tables, "inorganic filler content" represents inorganic filler content of resin. For example, in the insulation layer formed of inorganic fiber impregnated with resin, "inorganic filler content" represents an inorganic filler content of the resin before impregnation. Samples (A to I) have the same structure as the circuit board 10 of the embodiment except for those described in FIGS. 12 to 14. In samples (A to I), a core substrate, an insulation layer, a first resin layer, and a second resin layer correspond to the substrate 100, the insulation layer 1001, the resin layer 1002, and the resin layers 1003, respectively. Also, first copper foil, second copper foil, a first conductive layer, and a second conductive layer correspond to the metal foil 2001, the metal foil 2002, the conductive layer (100a), and the conductive layer (100b), respectively.

In the core substrates of samples (A to I), the insulation layer is made of the inorganic fiber impregnated with the epoxy resin, and the first and second resin layers are each made of the epoxy resin. However, the core substrate of sample (G) does not include the first and second resin layers.

In samples (A to C), as illustrated in FIG. 12, the insulation layer contains 65 wt % of the inorganic filler, and the first and second resin layers contain no inorganic filler. In samples (A to C), the first and second copper foils each have a thickness of 3 μm.

The insulation layers in samples (A, B, and C) have thicknesses of 94 μm, 142 μm, and 190 μm, respectively. The thickness of each of the first and second resin layers is 3 μm in sample (A), 4 μm in sample (B), and 5 μm in sample (C). The thickness of each of the first and second conductive layers is 15 μm in sample (A), 18 μm in sample (B), and 20 μm in sample (C). A rate of the thickness of each of the first and second resin layers with respect to the thickness of the core substrate is 6.00% in sample (A), 5.30% in sample (B), and 5.00% in sample (C).

In samples (A to C) having the above structures, peeling of the copper foil (first and second copper foil) and warping of the substrate hardly occurred. A circle mark in "evaluation" in FIG. 12 indicates that the result is good.

In samples (D to F), as illustrated in FIG. 13, the first copper foil and the second copper foil each have a thickness of 3 μm, and the first and second conductive layers each have a thickness of 18 μm.

An inorganic filler content of the insulation layer is 70 wt % in sample (D), 70 wt % in sample (E), and 50 wt % in sample (F). The inorganic filler content of each of the first and second resin layers is 51 wt % in sample (D), 3 wt % in sample (E), and 0 wt % in sample (F).

The thickness of the insulation layer is 86 μm in sample (D), 138 μm in sample (E), and 194 μm in sample (F). The thickness of each of the first and second resin layers is 7 μm in sample (D), 6 μm in sample (E), and 3 μm in sample (F). A rate of the thickness of each of the first and second resin layers with respect to the thickness of the core substrate is 14.00% in sample (D), 8.00% in sample (E), and 3.00% in sample (F).

In samples (D to F) having the above structures, hardly any peeling of the copper foil (the first copper foil and the second copper foil) nor any warping of the substrate occurred.

In samples (G to I), as illustrated in FIG. 14, the first copper foil and the second copper foil each have a thickness of 3 μm, and the first and second conductive layers each have a thickness of 18 μm.

The inorganic filler content of the insulation layer is 65 wt % in sample (G), 65 Wt % in sample (H), and 70 wt % in sample (I). The inorganic filler content of each of the first and second resin layers is 0 wt % in sample (H) and 70 wt % in sample (I).

The thickness of the insulation layer is 150 μm in sample (G), 140 μm in sample (H), and 194 μm in sample (I). The thickness of each of the first and second resin layers is 30 μm in sample (H) and 3 μm in sample (I). The rate of the thickness of each of the first and second resin layers with respect to that of the core substrate is 0.00% in sample (G), 30.00% in sample (H), and 3.00% in sample (I).

In sample (G) having the above structure, hardly any warping of the substrate occurred, but the copper foil (first and second copper foil) peeled. In sample (H) having the above structure, hardly any peeling occurred in the copper foil (first and second copper foil), but the substrate warped. In sample (I) having the above structure, hardly any warping of the substrate occurred, but the copper foil (first and second copper foil) peeled to a small extent. The "X" mark in the "evaluation" in FIG. 14 indicates that the result is a failure, and a triangle indicates that the result is not a failure.

As described above, peeling of the copper foil occurred in sample (G), but hardly any peeling of the copper foil occurred in samples (A to F). From this, it is thought that providing the first and second resin layers that contain no inorganic fiber suppresses peeling of the copper foil.

As described above, warping of the substrate occurred in sample (H), but hardly any warping occurred in samples (A to F). From this, warping of the substrate is thought to be suppressed when the sum of the thicknesses of the first and second resin layers is in a range not exceeding 20% of the thickness of the core substrate, and more preferably in a range of 2 to 15% of the core substrate.

As described above, peeling of the copper foil occurred slightly in sample (I), but hardly any occurred in samples (A to F). From these results, it is thought that peeling of the copper foil is suppressed by setting the content of the inorganic filler in each of the first and second resin layers to 10 wt % or less.

The circuit board 10 of the embodiment has the resin layers 1002 and 1003 which contain no inorganic fiber. In the circuit board 10 of the embodiment, the sum of the thicknesses of the resin layers 1002 and 1003 is 20% or less of the thickness of the substrate 100, and more specifically is in the range of 2 to 15% of the thickness of the core substrate. Therefore, the adhesiveness of the metal foil can be improved while warping of the printed circuit board is suppressed. Consequently, the electrical reliability of the printed circuit board can be improved. Also, it is thought that improvement of the electrical reliability of the printed circuit board improves the yield of the printed circuit boards.

Further, in the circuit board 10 of the embodiment, the content of the inorganic filler in each of the resin layers 1002 and 1003 is 10 wt % or less. It is thought that this improves the adhesiveness between the substrate 100 (core substrate) and the metal foil 2001 and 2002. However, that is not the only option, and it is thought that, when at least one of the resin layers 1002 and 1003 contains inorganic filler at the rate 10 wt % or less, peeling of the copper foil on this resin layer can be prevented.

In this embodiment, the resin layers 1002 and 1003 have substantially the same thickness. Also, the insulation layer 1001, and the resin layers 1002 and 1003 are made of the same resin (for example, epoxy resin). It is thought that these enhance the symmetry of the upper and lower sides of the insulation layer 1001, and suppress warping of the substrate 100.

In this embodiment, the portions of the resin layers 1002 and 1003 that contain no inorganic filler each have a thickness equal to or greater than an average diameter of the inorganic filler contained in the substrate 100. Also, no inorganic filler is exposed on either surface (F11) or (F12) of the substrate 100 (core substrate). It is thought that these improve the adhesiveness between the substrate 100 (core substrate) and the metal foil 2001 and 2002. The thicknesses of the portions of the resin layers 1002 and 1003 that contain no inorganic filler are each preferred to be equal to or greater than the diameter of the largest particle of inorganic filler contained in the substrate 100.

In this embodiment, both resin layers 1002 and 1003 are relatively thin, and thicknesses (D12) and (D13) are each 5 µm. Therefore, it is thought that providing the resin layers 1002 and 1003 containing neither the inorganic fiber nor the inorganic filler does not increase the coefficient of thermal expansion (CTE) of the substrate 100 to a large extent. Therefore, the electrical reliability of the circuit board 10 is improved while warping of the circuit board 10 is suppressed. In this embodiment, thicknesses (D12) and (D13) (FIG. 3) of the resin layers 1002 and 1003 are each 5 µm. It is thought that, to improve the electrical reliability of the circuit board 10 while suppressing the warping of the circuit board 10, the thicknesses of the resin layers 1002 and 1003 are each preferred to be in a range of 3 to 7 µm. Further, the thicknesses of the resin layers 1002 and 1003 are each preferred to be 5 µm or less. In this embodiment, the substrate 100 formed of the resin layer 1002, the insulation layer 1001, and the resin layer 1003 has a coefficient of thermal expansion of 6 ppm/K. To suppress warping of the circuit board 10, the coefficient of thermal expansion of the substrate 100 formed of the resin layer 1002, the insulation layer 1001, and the resin layer 1003 is preferred to be in a range of 5 to 7 ppm/K.

In this embodiment, the insulation layer 1001 is prepared by impregnating the unwoven fiberglass fabric with resin containing inorganic filler. The content of the inorganic filler is 65 wt %. For preferably decreasing the coefficient of thermal expansion of the substrate 100, in the resin with inorganic filler to be impregnated with the glass cloth in the insulation layer 1001, the inorganic filler content is preferred to be in a range of 40 to 70 wt %.

To prevent the lowering of the adhesiveness (or the connection reliability) of the conductive layers (100a and 100b), at least one of the resin layers 1002 and 1003 (more preferably, both of them) is preferred to contain inorganic filler through a depth of at least 3 µm from the surface (surface F11 or F12). In connection with the above, neither the resin layer 1002 nor the resin layer 1003 in the embodiment contains inorganic filler through a depth of 3 µm (thickness of the portion R12) or more from the surface (surface F11 or F 12), and it is thought that this improves the adhesiveness (connection property) of the conductive layers (100a and 100b).

A method for manufacturing the circuit board 10 (particularly, its core) according to the embodiment will be described.

Figure 15:
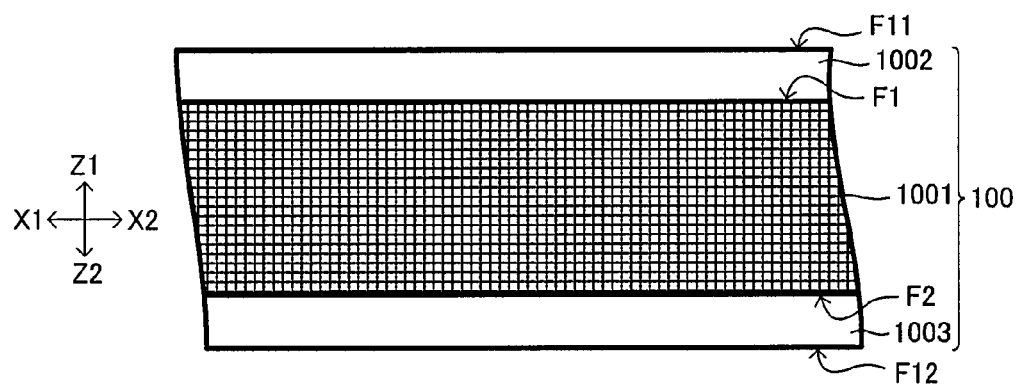
FIG. 15 is a view illustrating a step for preparing a substrate that forms a core of the printed circuit board in a manufacturing method of the printed circuit board according to the embodiment of the invention.

First, as illustrated in FIG. 15, the substrate 100 is prepared. More specifically, for example, glass cloth (inorganic fiber) is impregnated with uncured epoxy resin, and then the resin is cured to form the insulation layer 1001 in the completely cured state (C stage). Subsequently, for example, epoxy resin is applied over the surface (F1) of the insulation layer 1001 to form the resin layer 1002 and, for example, the epoxy resin is applied over the surface (F2) of the insulation layer 1001 to form the resin layer 1003. The insulation layer 1001 and the resin layers 1002 and 1003 each contain inorganic filler in such a way described above (see FIGS. 4A and 4B).

Figure 16:
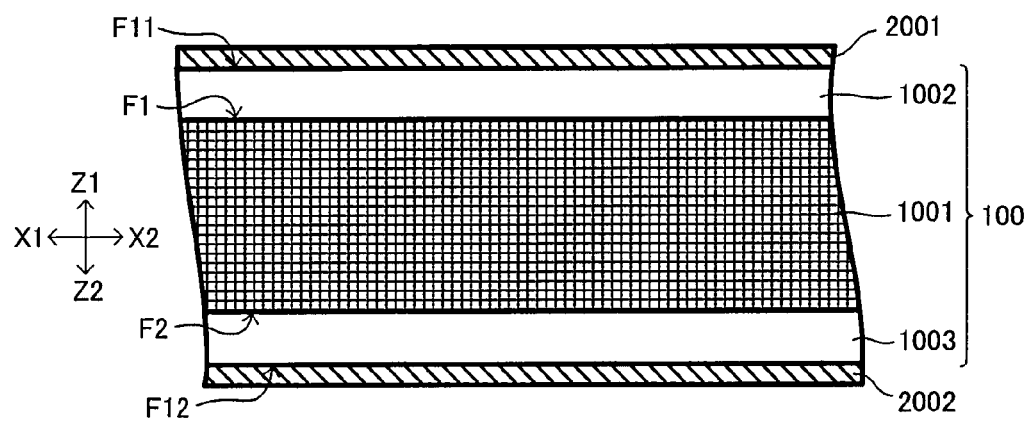
FIG. 16 is a view illustrating a step for arranging metal foil on both surfaces of the substrate prepared in the step in FIG. 15 in the manufacturing method of the printed circuit board according to the embodiment of the invention.

Subsequently, as illustrated in FIG. 16, the metal foil 2001 (for example, copper foil) is adhered to the upper surface (surface F11) of the resin layer 1002, and the metal foil 2002 (for example, copper foil) is adhered to the upper surface (surface F12) of the resin layer 1003. The metal foil 2001 and 2002 may be adhered after the resin layers 1002 and 1003 are completely cured, and alternatively may be adhered to the resin layers 1002 and 1003 in the incompletely cured state for enhancing their adhesiveness.

The substrate 100 in the completely cured state (C stage) is prepared as described above. When desired, heat treatment and the like may be performed to move (mix) the inorganic filler in the insulation layer 1001 into the resin layer 1002 or 1003 so that the content of the inorganic filler in the boundaries (near the surfaces F1 and F2) between the insulation layer 1001 and the resin layers 1002 and 1003 decreases as the distance from the insulation layer 1001 increases (see FIG. 4B).

Figure 17:
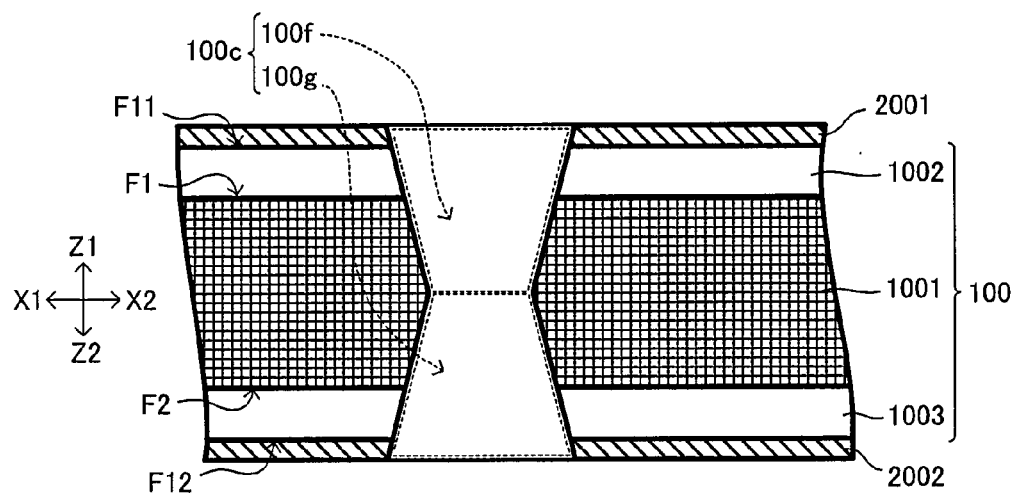
FIG. 17 is a view illustrating a step for forming a through hole extending through the substrate and the metal foil formed on both of its surfaces in the manufacturing method of the printed circuit board according to the embodiment of the invention.

Subsequently, as illustrated in FIG. 17, for example, $CO_2$ laser is used to form an aperture (1000 in the metal foil 2001 by irradiating it with laser. Also, an aperture (100g) is formed in the metal foil 2002 by irradiating it with the laser. The apertures (100f and 100g) are formed in substantially the same position on the X-Y plane, and will be finally connected to each other to form the through hole (100c) extending through the metal foil 2001, the substrate 100, and the metal foil 2002. The through hole (100c) has, for example, an hourglass-like shape. A boundary between the apertures (100f and 100g) is the narrowed portion (100e) (FIG. 1). The laser irradiation for forming the apertures (100f and 100g) may be performed simultaneously, or one surface at a time. To increase the absorption efficiency of the laser beam, black-oxide treatment may be performed on the surfaces of the metal foil 2001 and 2002 prior to the laser irradiation. The through hole (100c) may be formed by drilling or etching instead of using the laser. However, fine processing is easier to achieve by laser processing.

After forming the through hole (100c), desmearing is performed on the through hole (100c). The desmearing suppresses unwanted conduction (short circuiting).

Figure 18:
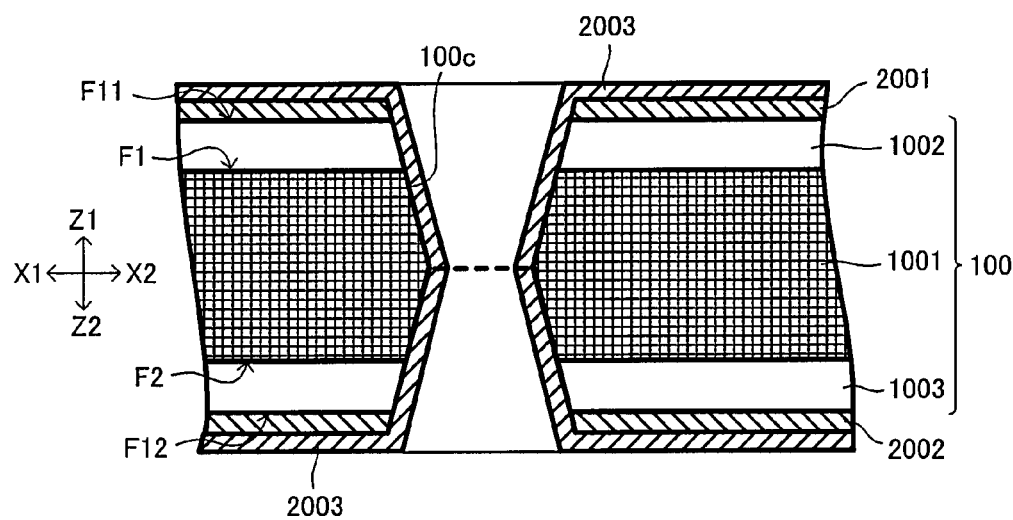
FIG. 18 is a view illustrating a first step for forming conductive layers on both surfaces of the substrate in the manufacturing method of the printed circuit board according to the embodiment of the invention.

Subsequently, as illustrated in FIG. 18, for example, a panel plating method is performed to form the electroless plating film 2003, for example, of copper on the metal foil 2001 and 2002 as well as in the through hole (100c). Chemical plating, for example, is employed for plating, and a copper sulfate solution, for example, with an added reducing agent and the like may be used as a plating solution.

Figure 19:
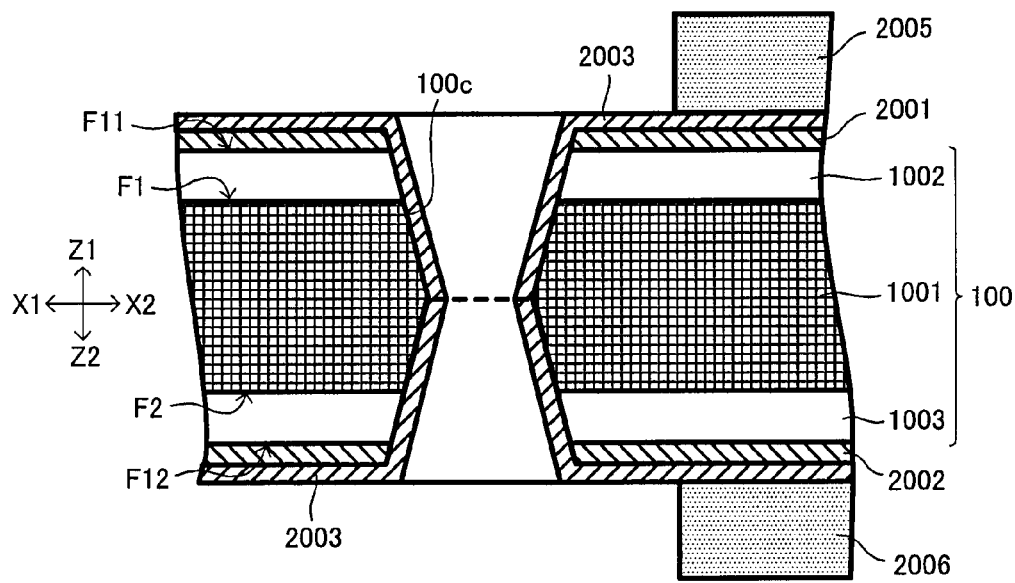
FIG. 19 is a view illustrating a second step after the step in FIG. 18.

Subsequently, as illustrated in FIG. 19, plating resists 2005 and 2006 having openings in predetermined positions are formed on both surfaces (on the electroless plating films 2003) of the substrate 100. The openings in the plating resists 2005 and 2006 are arranged corresponding to the conductive patterns (FIG. 3) of the conductive layers (100a and 100b), respectively.

Figure 20:
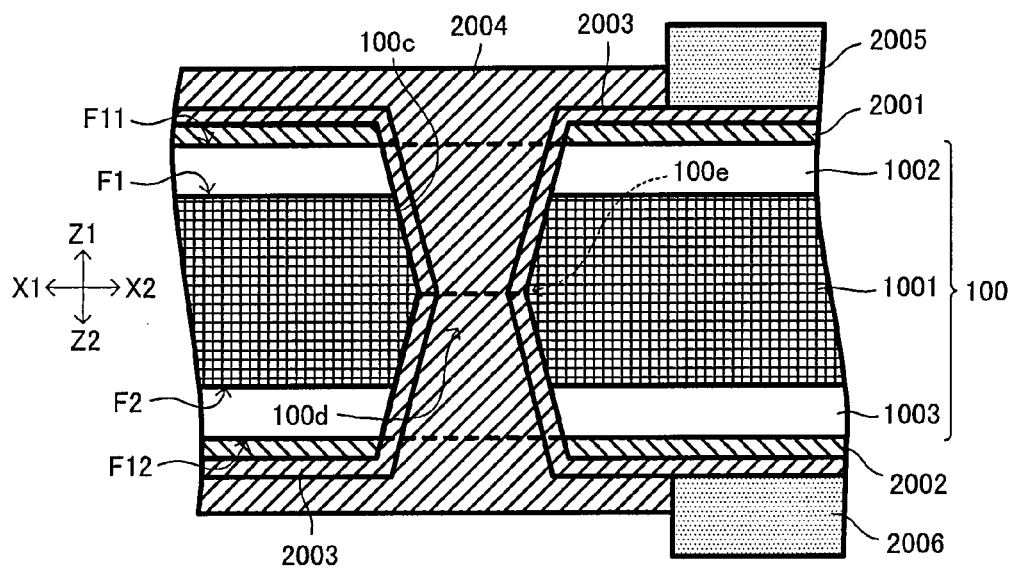
FIG. 20 is a view illustrating a third step after the step in FIG. 19.

Subsequently, as illustrated in FIG. 20, for example, a pattern plating method is performed to form the electrolytic plating 2004 made of copper, for example, in the openings of the plating resists 2005 and 2006. More specifically, the electrolytic plating is performed using the electroless plating film 2003 as a seed layer to deposit copper on the surface of the electroless plating film 2003. Accordingly, the through hole (100c) is filled with the electrolytic plating 2004 to form the through hole conductor (100d). Also, a conductive layer made up of the metal foil, the electroless plating film, and the electrolytic plating is formed on each of the resin layers 1002 and 1003. The plating solution is, for example, a copper sulfate solution, a pyrophosphoric acid copper solution, a copper cyanide solution, a boric-fluorinated copper solution, or the like. The seed layer for the electrolytic plating is not limited to an electroless plating film, and a sputter film or the like may also be used as a seed film instead of an electroless plating film.

Subsequently, the plating resists 2005 and 2006 are removed, for example, by a predetermined removal solution, and unnecessary electroless plating films 2003 and the metal foil 2001 and 2002 are further removed. Accordingly, the conductive layers (100a and 100b) (see FIG. 3) are formed. Consequently, the core of the circuit board 10 according to the present embodiment is completed.

Next, buildup sections are formed on both surfaces of the core of the circuit board 10. The buildup sections may be formed by a generally used method for forming a multilayer circuit board, such as a buildup-type process employing a plating method and using copper foil with resin. Each conductive layer can be formed by one or a combination of, for example, a panel plating method, pattern plating method, full-additive method, semi-additive (SAP) method, subtractive method, transfer method, and tenting method. Each insulation layer can be formed using, for example, prepreg or ABF (Ajinomoto Build-up Film manufactured by Ajinomoto Fine-Techno Co., Ltd.). The ABF is a film having an insulation material interposed between two protection films.

Accordingly, the circuit board 10 (FIG. 1) of the present embodiment is completed. The manufacturing method of the embodiment is suitable for manufacturing the circuit board 10. This manufacturing method can produce excellent circuit boards 10 at a low cost.

The present invention is not limited to the above embodiments. For example, the present invention may also be carried out by modifying the embodiments as follows.

The resin layer 1002 or 1003 may contain inorganic filler. For example, the resin layer 1002 or 1003 may contain 10 wt % (percentage by weight) or less of inorganic filler in its surface layer. In this case, it is thought that particle loss (see FIGS. 8A and 8B) described above is suppressed from occurring and the adhesiveness of the conductive layer is improved. It is also thought that the electrical reliability of the circuit board is improved. Further, as a result, the yield of the circuit boards is improved.

The inorganic filler contained in the resin layers 1002 and 1003 is preferably silica-based filler (dissolved quartz, isotropic silica, silica, talc, mica, kaolin, calcium silicate, or the like). However, the inorganic filler is not limited to silica-based filler, and any other type may be selected. The content of the inorganic filler is preferred to be substantially uniform, for example, substantially throughout the resin layers 1002 and 1003 except for the boundary.

Figure 21:
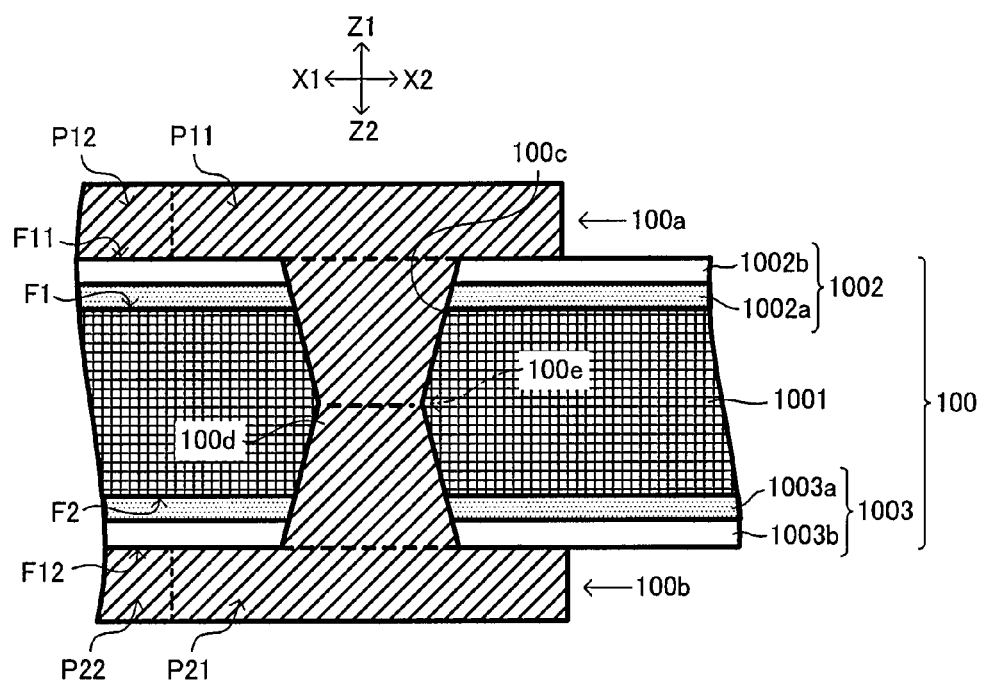
FIG. 21 is a view illustrating another embodiment of the present invention in which a resin layer that forms a core of a printed circuit board is made up of multiple layers containing different amounts of inorganic filler from each other.

As illustrated in FIG. 21, the resin layers 1002 and 1003 may each be formed with multiple layers whose inorganic filler content is different from one another. In the example in FIG. 21, the resin layer 1002 is formed of resin layers (1002a and 1002b), and the resin layer (1002a) contains inorganic filler of a content greater than that of the resin layer (1002b) and smaller than that of the insulation layer 1001. The resin layer 1003 is formed of resin layers (1003a and 1003b), and the resin layer (1003a) contains inorganic filler of a content greater than that of the resin layer (1003b) and smaller than that of the insulation layer 1001. The content of the inorganic filler is substantially uniform, for example, substantially throughout each resin layer (1002a, 1002b, 1003a, or 1003b) except for the boundary. It is an option for each of the resin layers (1002b and 1003b) not to contain inorganic filler.

The structure of the circuit board 10, and particularly the kinds, performances, sizes, materials, forms, number of layers, layout, and others of the components may be modified without deviating from a scope of the concept of the present invention.

The resin layers 1002 and 1003 may have different thicknesses, respectively. Different kinds of resin may be used for forming the insulation layer 1001, the resin layer 1002, and the resin layers 1003, respectively.

For example, the number of buildup sections is not limited to those described in the above embodiments. The number of buildup sections on the surface (F11) of the substrate 100 may be different from that on the surface (F12) of the substrate 100. However, to suppress stress, the number of buildup sections on the surface (F11) side of the substrate 100 is preferred to be the same as that on the surface (F12) side of the substrate 100 for enhancing the symmetry features of the upper and lower surfaces. The printed circuit board may be a single-sided printed circuit board in which a conductive layer and an interlayer insulation layer are formed on only one surface of an insulation layer.

The manufacturing method of the circuit board is not limited to the order and contents described in the embodiments, and may be modified without deviating from the gist of the present invention. Depending on a use or the like, some step may be omitted.

Regarding the embodiments above and their modifications (materials and others listed for each element), any combination thereof may be employed. It is preferred to select a proper combination based on a use and the like.

When second and third insulation layers contain inorganic fillers, for example, 40 to 60 parts by weight of inorganic fillers, the electrical reliability of a printed circuit board lowers. Lowered electrical reliability of the printed circuit board results in a lowering of a yield of the printed circuit boards.

When insulation layers (second and third insulation layers) not containing inorganic fillers are arranged on both surfaces of the first insulation layer and are thick (i.e., about 0.75 times thicker than the first insulation layer, about 15 times thicker than copper foil, and about 0.5 times thicker than the total core substrate thickness), a substrate of the printed circuit board has a greater coefficient of thermal expansion (CTE). Therefore, it is thought that the printed circuit board is likely to warp. Also, copper foil is likely to peel off.

A printed circuit board according to an embodiment of the present invention improves the adhesiveness of copper foil while suppressing the warping, and thereby can improve the electrical reliability of the printed circuit board. Further, a method for manufacturing a printed circuit board according to another embodiment of the present invention can improve the yield of the printed circuit boards.

A printed circuit board according to an embodiment of the invention includes: a core substrate having a first surface and a second surface opposite the first surface, and including a through hole; a first conductive pattern formed on the first surface; a second conductive pattern formed on the second surface; and a through hole conductor formed by filling the through hole with plating, and connecting the first and second conductive patterns to each other. The core substrate is formed of an insulation layer containing inorganic fiber and resin, a first resin layer formed on an upper surface of the insulation layer and having the first surface, and a second resin layer formed on a lower surface of the insulation layer and having the second surface, the first and second resin layers do not contain inorganic fiber, and a sum of thicknesses of the first and second resin layers is 20% or less of a thickness of the core substrate.

A manufacturing method of a printed circuit board according to another embodiment of the invention includes: preparing a core substrate having a first surface and a second surface opposite the first surface, including a through hole, and formed of an insulation layer containing inorganic fiber and resin, a first resin layer formed on an upper surface of the insulation layer and having the first surface, and a second resin layer formed on a lower surface of the insulation layer and having the second surface; forming a first conductive pattern on the first surface of the core substrate; forming a second conductive pattern on the second surface of the core substrate; and forming a through hole conductor connecting the first and second conductive patterns by filling the through hole with plating. The first and second resin layers do not contain inorganic fiber, and a sum of thicknesses of the first and second resin layers is 20% or less of the thickness of the core substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A printed circuit board, comprising:
   a core substrate;
   a first conductive pattern formed on a first surface of the core substrate;
   a second conductive pattern formed on a second surface of the core substrate on an opposite side of the core substrate with respect to the first surface; and
   a through hole conductor formed through the core substrate and comprising a plated material such that the through hole conductor is connecting the first conductive pattern and the second conductive pattern,
   wherein the plated material of the through hole conductor is formed in a through hole formed in the core substrate such that the plated material is filling the through hole of the core substrate, the core substrate includes an insulation layer including an inorganic fiber material and a resin material, a first resin layer formed on one surface of the insulation layer and having the first surface of the core substrate, and a second resin layer formed on an opposite surface of the insulation layer and having the second surface of the core substrate, the first and second resin layers are formed such that the first and second resin layers do not contain an inorganic fiber material and a sum of thicknesses of the first and second resin layers is set in a range of 20% or less of a thickness of the core substrate, the first resin layer of the core substrate includes an inorganic filler material, the second resin layer of the core substrate includes an inorganic filler material, and the first resin layer of the core substrate includes the inorganic filler material such that an amount of the inorganic filler material in the first resin layer decreases from the insulation layer toward the first surface of the core substrate.

2. The printed circuit board according to claim 1, wherein the sum of thicknesses of the first and second resin layers is set in a range of from 2% to 15% of the thickness of the core substrate.

3. The printed circuit board according to claim 1, wherein the second resin layer of the core substrate includes the inorganic filler material such that an amount of the inorganic filler material in the second resin layer decreases from the insulation layer toward the second surface of the core substrate.

4. The printed circuit board according to claim 1, wherein the inorganic fiber material of the insulation layer is impregnated with the resin material including an inorganic filler material in an amount in a range of 40 wt % and 70 wt %.

5. The printed circuit board according to claim 1, wherein the first resin layer in the core substrate has the thickness which is substantially equal to the thickness of the second resin layer in the core substrate.

6. The printed circuit board according to claim 1, wherein the first resin layer in the core substrate has the thickness set in a range of from 3 μm to 7 μm, and the second resin layer in the core substrate has the thickness set in a range of from 3 μm to 7 μm.

7. The printed circuit board according to claim 1, wherein the inorganic filler material in the first resin layer is in an amount set in a range of from 10 wt % or less.

8. The printed circuit board according to claim 1, wherein the inorganic filler material in the second resin layer is in an amount set in a range of from 10 wt % or less.

9. The printed circuit board according to claim 1, wherein the first resin layer includes a resin material which is substantially same as the resin material of the insulation layer, and the second resin layer includes a resin material which is substantially same as the resin material of the insulation layer.

10. The printed circuit board according to claim 1, wherein at least one of the first resin layer and the second resin layer is formed such that the inorganic filler material is not present in a depth of at least 3 μm from a respective one of the first and second surfaces of the core substrate.

11. The printed circuit board according to claim 1, wherein the inorganic filler material in the first resin layer is in an amount set in a range of from 10 wt % or less, and the inorganic filler material in the second resin layer is in an amount set in a range of from 10 wt % or less.

12. The printed circuit board according to claim 11, wherein the sum of thicknesses of the first and second resin layers is set in a range of from 2% to 15% of the thickness of the core substrate.

13. The printed circuit board according to claim 12, wherein at least one of the first resin layer and the second resin layer is formed such that the inorganic filler material is not present in a depth of at least 3 μm from a respective one of the first and second surfaces of the core substrate.

14. A printed circuit board, comprising:
a core substrate;
a first conductive pattern formed on a first surface of the core substrate;
a second conductive pattern formed on a second surface of the core substrate on an opposite side of the core substrate with respect to the first surface; and
a through hole conductor formed through the core substrate and comprising a plated material such that the through hole conductor is connecting the first conductive pattern and the second conductive pattern,
wherein the plated material of the through hole conductor is formed in a through hole formed in the core substrate such that the plated material is filling the through hole of the core substrate, the core substrate includes an insulation layer including an inorganic fiber material and a resin material, a first resin layer formed on one surface of the insulation layer and having the first surface of the core substrate, and a second resin layer formed on an opposite surface of the insulation layer and having the second surface of the core substrate, the first and second resin layers are formed such that the first and second resin layers do not contain an inorganic fiber material and a sum of thicknesses of the first and second resin layers is set in a range of 20 % or less of a thickness of the core substrate, the first resin layer of the core substrate includes an inorganic filler material, the second resin layer of the core substrate includes an inorganic filler material, and the first resin layer and second resin layer are formed such that the first resin layer and second resin layer do not have the inorganic filler materials exposed on the first surface and second surface of the core substrate.

15. A method for manufacturing a printed circuit board, comprising:
forming a core substrate having a through hole penetrating through the core substrate;
forming a first conductive pattern on a first surface of the core substrate;
forming a second conductive pattern on a second surface of the core substrate on an opposite side of the core substrate with respect to the first surface;
forming a through hole conductor comprising a plated material in the through hole in the core substrate such that the through hole is filled by the plated material and the through hole conductor connects the first conductive pattern and the second conductive pattern,
wherein the forming of the core substrate includes forming an insulation layer comprising an inorganic fiber material and a resin material, forming a first resin layer on one surface of the insulation layer such that the first resin layer forms the first surface of the core substrate, and forming a second resin layer on an opposite surface of the insulation layer such that the second resin layer forms the second surface of the core substrate, the first and second resin layers are formed such that the first and second resin layers do not contain an inorganic fiber material and a sum of thicknesses of the first and second resin layers is set in a range of 20% or less of a thickness of the core substrate, the forming of the first resin layer includes including an inorganic filler material, the forming of the second resin layer includes including an inorganic filler material, and the first resin layer of the core substrate is formed such that an amount of the inorganic filler material in the first resin layer decreases from the insulation layer toward the first surface of the core substrate.

16. The method for manufacturing a printed circuit board according to claim 15, the forming of the insulation layer includes impregnating the inorganic fiber material with the resin material and drying the insulation layer, the forming of the first resin layer includes coating a resin material on the one surface of the insulation layer, and the forming of the second resin layer includes coating a resin material on the opposite surface of the insulation layer.

17. The method for manufacturing a printed circuit board according to claim 15, wherein the first resin layer and the second resin layer are formed such that the sum of thicknesses of the first and second resin layers is set in a range of from 2% to 15% of the thickness of the core substrate.

18. The method for manufacturing a printed circuit board according to claim 15, wherein the second resin layer of the core substrate is formed such that an amount of the inorganic filler material in the second resin layer decreases from the insulation layer toward the second surface of the core substrate.

19. The method for manufacturing a printed circuit board according to claim 18, wherein the inorganic filler material is included in the first resin layer in an amount of from 10 wt % or less, and the inorganic filler material is included in the second resin layer in an amount of from 10 wt % or less.

20. The method for manufacturing a printed circuit board according to claim 19, wherein at least one of the first resin layer and the second resin layer is formed such that the inorganic filler material is not present in a depth of at least 3 μm from a respective one of the first and second surfaces of the core substrate.

* * * * *